(12) United States Patent
Suzuki et al.

(10) Patent No.: US 8,585,847 B2
(45) Date of Patent: Nov. 19, 2013

(54) COMPOSITE SUBSTRATE AND MANUFACTURING METHOD THEREOF

(75) Inventors: Kenji Suzuki, Nagoya (JP); Yasunori Iwasaki, Kitanagoya (JP); Takashi Yoshino, Ama-Gun (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 13/546,200

(22) Filed: Jul. 11, 2012

(65) Prior Publication Data
US 2012/0273117 A1 Nov. 1, 2012

Related U.S. Application Data (62) Division of application No. 12/641,741, filed on Dec. 18, 2009, now Pat. No. 8,288,918.

(30) Foreign Application Priority Data

Dec. 24, 2008 (JP) ................................ 2008-326878

(51) Int. Cl.
*H01L 41/22* (2013.01)
(52) U.S. Cl.
USPC ........................................................ 156/154
(58) Field of Classification Search
USPC .................................. 156/153, 154
See application file for complete search history.

(56) References Cited

U.S. PATENT DOCUMENTS

| | | | |
|---|---|---|---|
| 5,087,307 A * | 2/1992 | Nomura et al. | 156/154 |
| 5,668,045 A * | 9/1997 | Golland et al. | 438/459 |
| 6,113,721 A * | 9/2000 | Secco d'Aragona et al. | 156/154 |
| 6,285,866 B1 * | 9/2001 | Lee et al. | 455/318 |
| 6,914,367 B2 | 7/2005 | Furukawa | |
| 7,656,070 B2 | 2/2010 | Kadota et al. | |
| 8,173,518 B2 * | 5/2012 | Liu et al. | 438/455 |

FOREIGN PATENT DOCUMENTS

| | | |
|---|---|---|
| JP | 59-164150 A | 9/1984 |
| JP | 60-206214 A | 10/1985 |
| JP | 01-227441 | 9/1989 |
| JP | 02-273923 | 11/1990 |
| JP | 02-274009 A | 11/1990 |
| JP | 03-243099 A | 10/1991 |
| JP | 2000-065662 A | 3/2000 |
| JP | 2002-026684 | 1/2002 |
| JP | 2006-319679 A1 | 11/2006 |

OTHER PUBLICATIONS

Japanese Office Action (With English Translation), Japanese Application No. 2009-287867, dated Jun. 25, 2013 (4 pages).

* cited by examiner

*Primary Examiner* — Jeff Aftergut
(74) *Attorney, Agent, or Firm* — Burr & Brown (57) ABSTRACT

A supporting substrate and a piezoelectric substrate are prepared. A surface of the supporting substrate is bonded to the backside of the piezoelectric substrate with an organic adhesive layer interposed therebetween to form a laminated substrate. Subsequently, a peripheral surface of the laminated substrate is ground such that a peripheral surface of the piezoelectric substrate, a peripheral surface of the organic adhesive layer, and a peripheral surface of the supporting substrate on the side of the organic adhesive layer are made flush with each other. Subsequently, the surface of the piezoelectric substrate is polished to reduce the thickness of the piezoelectric substrate and performing mirror polishing of the surface.

4 Claims, 6 Drawing Sheets

First

Second

Third

Forth

Fifth

Fig. 9

First

Second

Third

Forth

Fifth

Fig. 10

COMPOSITE SUBSTRATE AND MANUFACTURING METHOD THEREOF

CROSS-REFERENCE TO RELATED APPLICATIONS

This application is a divisional application of U.S. patent application Ser. No. 12/641,741, filed Dec. 18, 2009, and claims the benefit under 35 USC §119(a)-(d) of Japanese Patent Application No. 2008-326878, filed Dec. 24, 2008, the entireties of which are incorporated herein by reference.

FIELD OF THE INVENTION

The present invention relates to a method for manufacturing a composite substrate and to a composite substrate.

BACKGROUND OF THE INVENTION

It is already known that a composite substrate, in which a supporting substrate and a piezoelectric substrate are bonded together, is provided with electrodes to fabricate elastic wave devices. For example, as elastic wave devices, surface acoustic wave devices and bulk acoustic wave devices have been used as band-pass filters in communication devices, such as mobile phones. Composite substrates are known to use lithium niobate or lithium tantalate as a piezoelectric substrate and silicon or quartz as a supporting substrate (see Patent Document 1).
[Patent Document 1] Japanese Unexamined Patent Application Publication No. 2006-319679

Such composite substrates are often manufactured by preparing a piezoelectric substrate and a supporting substrate, bonding the piezoelectric substrate to the supporting substrate with an organic adhesive layer interposed therebetween, and reducing the thickness of the piezoelectric substrate. Since an edge of a substrate may hit something and be broken during handling, a piezoelectric substrate is generally beveled. When the thickness of a piezoelectric substrate is decreased, abrasive grains are placed between a surface of a piezoelectric substrate and a lapping plate, and the surface of the piezoelectric substrate is lapped with the lapping plate. However, according to such a manufacturing method, when a piezoelectric substrate and a supporting substrate are bonded together, an organic adhesive layer is not fully applied up to a beveled edge of the piezoelectric substrate. Furthermore, since beveling increases the distance between the piezoelectric substrate and the supporting substrate, an edge of the piezoelectric substrate is not bonded to the supporting substrate. In such a state, lapping of the surface of the piezoelectric substrate with a lapping plate causes a problem of frequent occurrence of chipping from the edge.

SUMMARY OF THE INVENTION

In view of the problems described above, for a composite substrate in which a piezoelectric substrate is bonded to a supporting substrate with an organic adhesive layer interposed therebetween, it is a principal object of the present invention to prevent chipping of an edge of the piezoelectric substrate when the surface of the piezoelectric substrate is treated with abrasive grains.

Means for Solving the Problem

To achieve this object, the present invention has employed the following means.

The present invention provides a method for manufacturing a composite substrate invention including the steps of:
 (a) preparing a supporting substrate and a piezoelectric substrate having a beveled edge;
 (b) bonding a surface of the supporting substrate to the backside of the piezoelectric substrate with an organic adhesive layer interposed therebetween to form a laminated substrate;
 (c) grinding a peripheral surface of the laminated substrate such that a bevel of the piezoelectric substrate is removed and such that a peripheral surface of the piezoelectric substrate, a peripheral surface of the organic adhesive layer, and a peripheral surface of the supporting substrate on the side of the organic adhesive layer are made flush with each other; and
 (d) placing abrasive grains between the surface of the piezoelectric substrate and a lapping plate, and lapping the surface of the piezoelectric substrate with the lapping plate to reduce the thickness of the piezoelectric substrate and performing mirror polishing of the surface of the piezoelectric substrate,
 wherein the grinding of a peripheral surface of the laminated substrate in the step (c) is performed such that the initial outer diameter of the supporting substrate is maintained.

The present invention provides a composite substrate, including:
 a supporting substrate;
 a piezoelectric substrate; and
 an organic adhesive layer for bonding the piezoelectric substrate to the supporting substrate,
 wherein a peripheral surface of the piezoelectric substrate, a peripheral surface of the organic adhesive layer, and a peripheral surface of the supporting substrate on the side of the organic adhesive layer are flush with each other, and
 the supporting substrate has an outer diameter larger than the outer diameter of the peripheral surface of the supporting substrate on the side of the organic adhesive layer.

In accordance with a method for manufacturing a composite substrate according to the present invention, when the step (d) is performed, the peripheral surface of the piezoelectric substrate has no bevel and is flush with the peripheral surface of the organic adhesive layer. Thus, an edge of the piezoelectric substrate is bonded to the supporting substrate via the organic adhesive layer and is resistant to chipping, as compared with a state in which an edge of the piezoelectric substrate is not bonded to the supporting substrate, for example, because of beveling. In a composite substrate in which a piezoelectric substrate is bonded to a supporting substrate with an organic adhesive layer interposed therebetween, therefore, chipping of an edge of the piezoelectric substrate can be prevented when the surface of the piezoelectric substrate is treated with abrasive grains. This is probably because, when an edge of the piezoelectric substrate is riot bonded to the supporting substrate, lapping and polishing of the surface of the piezoelectric substrate forms a sharp edge, and force in the thickness direction of the piezoelectric substrate during lapping and polishing tends to cause chipping, but when an edge of the piezoelectric substrate is bonded to the supporting substrate, such chipping rarely occurs. Furthermore, in accordance with a method for manufacturing a composite substrate according to the present invention, after the step (c) is performed, the peripheral surface of the piezoelectric substrate, the peripheral surface of the organic adhesive layer, and the peripheral surface of the supporting substrate on the side of the organic adhesive layer are flush with each other. This ensures that no organic adhesive layer exists outside the peripheral surface of the piezoelectric substrate. Thus, in the step (d), when the surface of the piezoelectric substrate is polished, this can prevent the organic adhesive layer from being detached and attaching as a contaminant to the surface of the piezoelectric substrate or adversely affecting surface finishing. Furthermore, in accordance with a method for manufacturing a composite substrate according to the present invention, since the step (c) involves grinding a peripheral surface of the laminated substrate such that the initial outer diameter of the supporting substrate is maintained, apparatuses and jigs according to the specifications based on the constant outer diameter can be used before and after the step (c).

DETAILED DESCRIPTION OF THE INVENTION

In a method for manufacturing a composite substrate according to the present invention, the step (a) involves preparing a supporting substrate and a piezoelectric substrate that can propagate an elastic wave and has a beveled edge. The piezoelectric substrate may be a substrate that can propagate an elastic wave (in particular, a surface acoustic wave). Examples of the material of the piezoelectric substrate include lithium tantalate, lithium niobate, lithium niobate-lithium tantalate solid solution single crystal, lithium borate, langasite, and crystal. Although the size of the piezoelectric substrate is not limited, for example, the diameter ranges from 50 to 150 mm, and the thickness ranges from 150 to 500 μm. Furthermore, since the piezoelectric substrate has a beveled edge, even when the edge hits something during the transfer of the piezoelectric substrate, the edge rarely chips. Beveling may be C-beveling, in which an intersecting portion of two surfaces (an edge) is cut at a predetermined angle, or R-beveling, in which the edge is cut at a predetermined curvature radius. The backside of the piezoelectric substrate may be overlaid with, for example, a metal or silicon dioxide layer having a thickness in the range of 0.1 to 5 μm. Examples of the material of the supporting substrate include silicon, sapphire, aluminum nitride, alumina, borosilicate glass, quartz glass, spinel, lithium tantalate, lithium niobate, lithium niobate-lithium tantalate solid solution single crystal, lithium borate, langasite, and crystal. Although the size of the supporting substrate is not limited, for example, the diameter ranges from 50 to 150 mm, and the thickness ranges from 150 to 500 μm. The supporting substrate may have a beveled edge.

In a method for manufacturing a composite substrate according to the present invention, the step (b) involves bonding a surface of the supporting substrate to the backside of the piezoelectric substrate with an organic adhesive layer interposed therebetween to form a laminated substrate. For example, an organic adhesive is uniformly applied to one or both of the surface of the supporting substrate and the backside of the piezoelectric substrate and is solidified while the piezoelectric substrate is placed on the supporting substrate to form a laminated substrate. Examples of a method for applying the organic adhesive include spin coating and printing. Examples of the organic adhesive include an epoxy adhesive and an acrylic adhesive. When a supporting substrate having a smaller thermal expansion coefficient than the piezoelectric substrate is prepared in the step (a), the organic adhesive layer formed by heating preferably has a thickness in the range of 0.1 to 1.0 μm. Examples of such a case include a case in which the piezoelectric substrate is formed of a material selected from the group consisting of lithium tantalate, lithium niobate, lithium niobate-lithium tantalate solid solution single crystal, lithium borate, langasite, and crystal and the supporting substrate is formed of a material selected from the group consisting of silicon, sapphire, aluminum nitride, alumina, borosilicate glass, and quartz glass. In that case, when a surface acoustic wave element is manufactured using a finally manufactured composite substrate, the surface acoustic wave element can exhibit relatively small variations in frequency characteristics with temperature changes. When the organic adhesive layer has a thickness above 1.0 μm, the organic adhesive layer reduces a difference in thermal expansion coefficient between the piezoelectric substrate and the supporting substrate, and unfavorably the effect of reducing variations in frequency characteristics with temperature changes cannot be achieved. When the organic adhesive layer has a thickness below 0.1 μm unfavorably the effect of reducing variations in frequency characteristics with temperature changes cannot be achieved because of the effects of voids.

In a method for manufacturing a composite substrate according to the present invention, the step (c) involves grinding a peripheral surface of the laminated substrate such that a bevel of the piezoelectric substrate is removed and such that a peripheral surface of the piezoelectric substrate, a peripheral surface of the organic adhesive layer, and a peripheral surface of the supporting substrate on the side of the organic adhesive layer are made flush with each other. In the grinding of a peripheral surface of the laminated substrate in the step (c), grinding is performed such that the initial outer diameter of the supporting substrate is maintained. Examples of a grinding apparatus for grinding a peripheral surface of the laminated substrate include a grinding apparatus in which a peripheral surface of a rotating laminated substrate is brought into contact with a whetstone of a rotating grinding wheel, a grinding apparatus in which a peripheral surface of a rotating laminated substrate is brought into contact with a nonrotating whetstone, and a grinding apparatus in which a whetstone of a rotating grinding wheel that revolves about a laminated substrate is brought into contact with a peripheral surface of the laminated substrate. In the step (c), the laminated substrate is ground such that at least part of the supporting substrate is ground and such that a peripheral surface of the piezoelectric substrate, a peripheral surface of the organic adhesive layer, and a peripheral surface of the supporting substrate on the side of the organic adhesive layer are made flush with each other. This ensures the removal of a portion of the organic adhesive layer disposed outside the peripheral surface of the piezoelectric substrate. Consequently, in the subsequent steps, this can prevent the organic adhesive layer from being detached and attaching as a contaminant to the surface of the piezoelectric substrate or adversely affecting finishing of the surface of the piezoelectric substrate. Furthermore, since the peripheral surface of the laminated substrate is ground such that the initial outer diameter of the supporting substrate is maintained, apparatuses and jigs according to the specifications based on the constant outer diameter can be used before and after the step (c).

In a method for manufacturing a composite substrate according to the present invention, the step (d) involves placing abrasive grains between the surface of the piezoelectric substrate and a lapping plate, and lapping the surface of the piezoelectric substrate with the lapping plate to reduce the thickness of the piezoelectric substrate and performing mirror polishing of the surface of the piezoelectric substrate. Examples of an apparatus used in the step (d) include general lapper and polisher. For example, with a lapper and polisher for lapping and polishing one side of a laminated substrate, a laminated substrate to be lapped is first placed under pressure between a pressure plate and a lapping plate, and the pressure plate is rotated while slurry containing abrasive grains is supplied between the laminated substrate and the lapping plate, thereby reducing the thickness of the piezoelectric substrate. Subsequently, the lapping plate is replaced with a lapping plate having a pad on the surface, and the abrasive grains are replaced with abrasive grains having a higher grit number. The pressure plate is rotated and revolved to perform mirror polishing of the surface of the piezoelectric substrate. Since the step (c) involves grinding a peripheral surface of the laminated substrate such that a bevel of the piezoelectric substrate is removed and such that a peripheral surface of the piezoelectric substrate and a peripheral surface of the organic adhesive layer are made flush with each other, in the laminated substrate subjected to the step (d), an edge of the piezoelectric substrate is bonded to the supporting substrate with the organic adhesive layer interposed therebetween. Thus, in treatment of the surface of the piezoelectric substrate with abrasive grains, an edge of the piezoelectric substrate is resistant to chipping, as compared with a substrate an edge of which is not bonded to the supporting substrate (for example, the laminated substrate before the step (c)).

Figure 1:
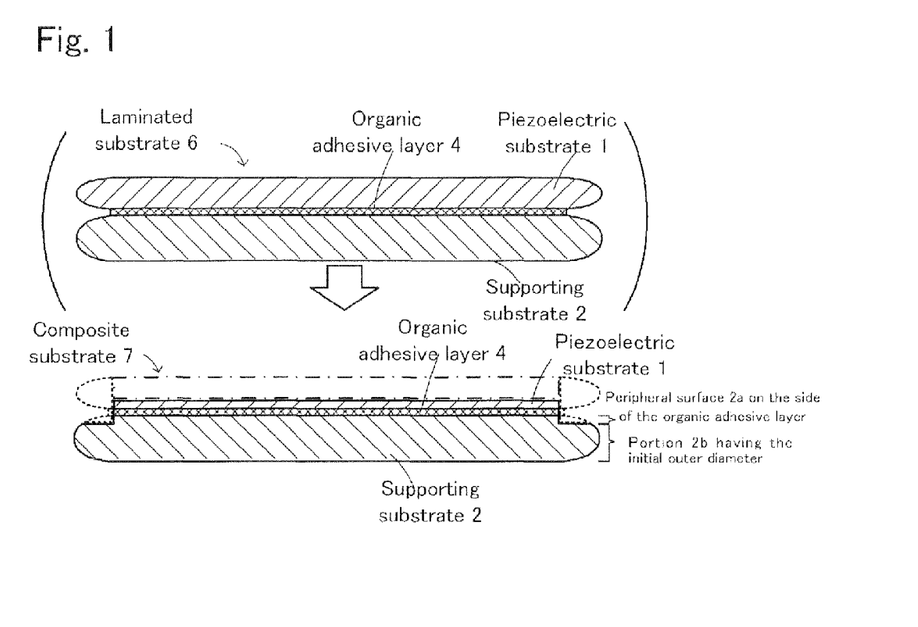
FIG. 1 is a cross-sectional view of a composite substrate manufactured by a method for manufacturing a composite substrate according to the present invention.

FIG. 1 illustrates a cross section of a specific example of a composite substrate manufactured by the above-mentioned method for manufacturing a composite substrate. In the figure, a portion within a dotted line represents a portion ground in the step (c), and a portion within an alternate long and short dashed line represents a portion removed by lapping and polishing in the step (d). FIG. 1 illustrates a composite substrate 7 prepared by grinding the laminated substrate such that a peripheral surface of the piezoelectric substrate 1, a peripheral surface of the organic adhesive layer 4, and a peripheral surface 2a of the supporting substrate 2 on the side of the organic adhesive layer 4 are made flush with each other and polishing the piezoelectric substrate 1. A portion within parentheses in FIG. 1 represents the laminated substrate 6 prepared in the step (b). Since the composite substrate 7 illustrated in FIG. 1 is manufactured by the above-mentioned manufacturing method, an edge of the piezoelectric substrate 1 is resistant to chipping. Furthermore, since no organic adhesive layer 4 exists outside the peripheral surface of the piezoelectric substrate 1, when the surface of the piezoelectric substrate 1 is polished, the organic adhesive layer 4 is prevented from being detached and attaching as a contaminant to the surface of the piezoelectric substrate 1 or adversely affecting surface finishing. Furthermore, since the initial outer diameter of the supporting substrate 2 is maintained even after the grinding in the step (c), apparatuses and jigs according to the specifications based on the outer diameter before the grinding in the step (c) can be used.

Figure 2:
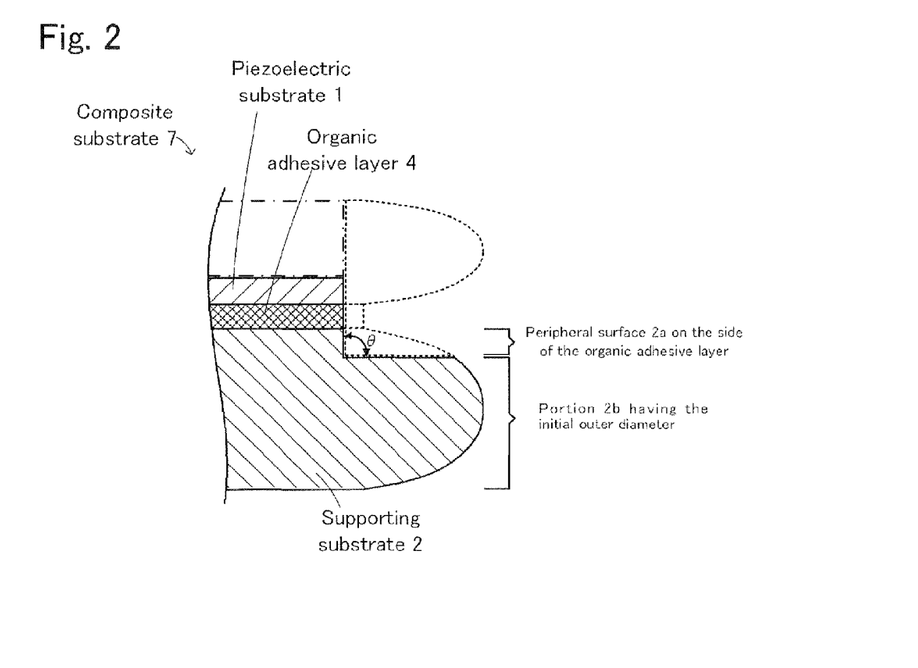
FIG. 2 is a fragmentary sectional view of a composite substrate manufactured by a method for manufacturing a composite substrate according to the present invention.

In a method for manufacturing a composite substrate according to the present invention described above, the angle θ between a plane on the side of the organic adhesive layer 4 in a portion 2b of the supporting substrate 2 having the initial outer diameter and the peripheral surface 2a of the supporting substrate 2 on the side of the organic adhesive layer 4 may be more than 0° but less than 180° (see the fragmentary sectional view of the composite substrate in FIG. 2). The angle θ is more preferably more than 90° but less than 180°, because at this range the angle between the top of the piezoelectric substrate 1 and the peripheral surface of the piezoelectric substrate 1 is an obtuse angle, and the same effect as beveling can be obtained. The angle θ may be more than 0° but less than 90°. In this case, the edge between the top of the piezoelectric substrate 1 and the peripheral surface of the piezoelectric substrate 1 may be beveled.

Figure 3:
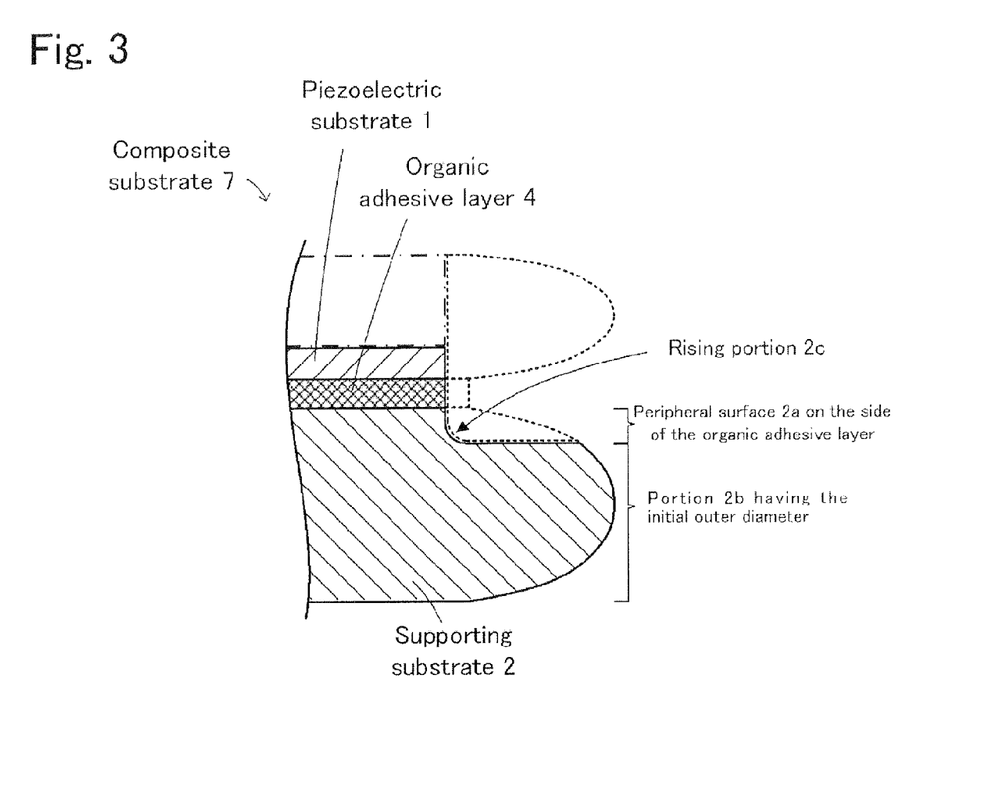
FIG. 3 is a fragmentary sectional view of a composite substrate manufactured by a method for manufacturing a composite substrate according to the present invention.

In a method for manufacturing a composite substrate according to the present invention described above, it is preferable that the grinding of a peripheral surface of the laminated substrate 6 in the step (c) is performed, as illustrated in a fragmentary sectional view of FIG. 3, such that a portion 2c rising from a plane on the side of the organic adhesive layer 4 in a portion 2b of the supporting substrate 2 having the initial outer diameter of the supporting substrate 2 to the peripheral surface on the side of the organic adhesive layer 4 has a curved surface. If there is a line of intersection between a plane on the side of the organic adhesive layer 4 in a portion 2b of the supporting substrate 2 having the initial outer diameter and the peripheral surface of the supporting substrate 2 on the side of the organic adhesive layer 4, in lapping and polishing of the peripheral surface of the laminated substrate 6 in the step (c) described above, a stress placed on the line of intersection may cause chipping of the supporting substrate 2. Grinding the supporting substrate such that the rising portion 2c has a curved surface as illustrated in FIG. 3 can eliminate the line of intersection and thereby prevent chipping of the supporting substrate 2.

A composite substrate according to the present invention includes a supporting substrate, a piezoelectric substrate, and an organic adhesive layer for bonding the piezoelectric substrate to the supporting substrate. A peripheral surface of the piezoelectric substrate, a peripheral surface of the organic adhesive layer, and a peripheral surface of the supporting substrate on the side of the organic adhesive layer are flush with each other. The supporting substrate has an outer diameter larger than the outer diameter of the peripheral surface on the side of the organic adhesive layer. Such a composite substrate can be manufactured, for example, by the above-mentioned method for manufacturing a composite substrate.

Example 1

Figure 4A:
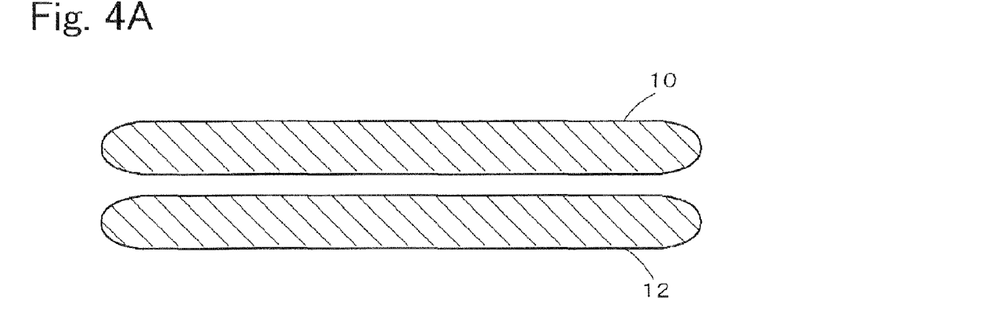
FIG. 4 shows schematic cross-sectional views of a manufacturing process of a composite substrate.
Figure 4B:
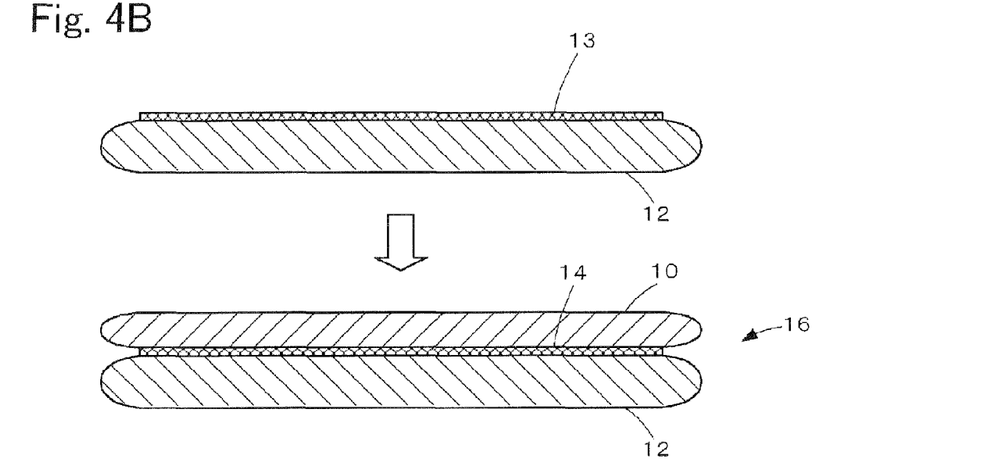

FIG. 4 shows schematic cross-sectional views of a manufacturing process of a composite substrate according to the present example. First, a lithium tantalate substrate (an LT substrate) 10 that had an orientation flat portion (an OF portion) and had a diameter of 100 mm and a thickness of 250 μm was prepared as a piezoelectric substrate. A silicon substrate 12 that had an OF portion and had a diameter of 100 mm and a thickness of 350 μm was prepared as a supporting substrate (FIG. 4(a)). The LT substrate 10 was a 36° Y-cut X-propagation LT substrate, in which X denotes the propagation direction of a surface acoustic wave (SAW), and 36° Y-cut denotes the cut angle of the substrate rotated about the X-axis with a rotational angle 36° from the Y-axis toward Z-axis. The LT substrate 10 and the silicon substrate 12 had a beveled edge. FIG. 5 is a fragmentary sectional view illustrating a bevel. As illustrated in the figure, the bevel extended from 300 μm inside a peripheral surface of the LT substrate 10 and had an angle of 20° at this position. An epoxy adhesive 13 was then applied to the silicon substrate 12 by spin coating. The LT substrate 10 was attached to the silicon substrate 12 and was heated to 180° C. Thus, a laminated substrate 16, which included an organic adhesive layer 14 (a layer formed by solidification of the epoxy adhesive 13) having a thickness of 0.3 μm was formed (FIG. 4(b)).

Figure 4C:
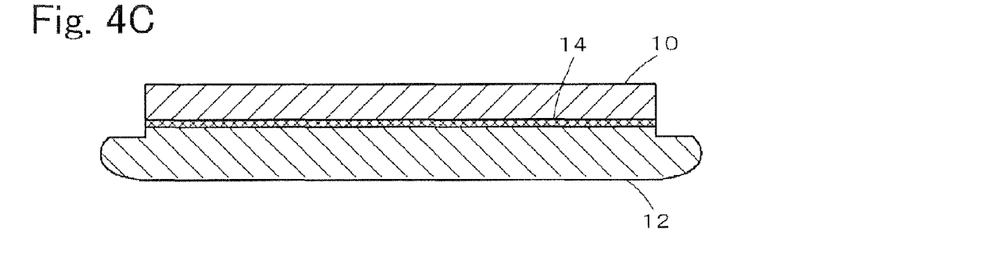
Figure 6:
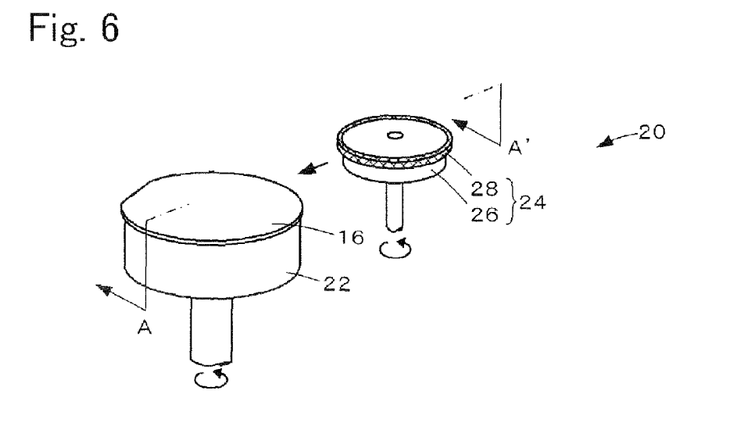
FIG. 6 is a schematic explanatory drawing of the structure of a grinding apparatus 20.
Figure 7:
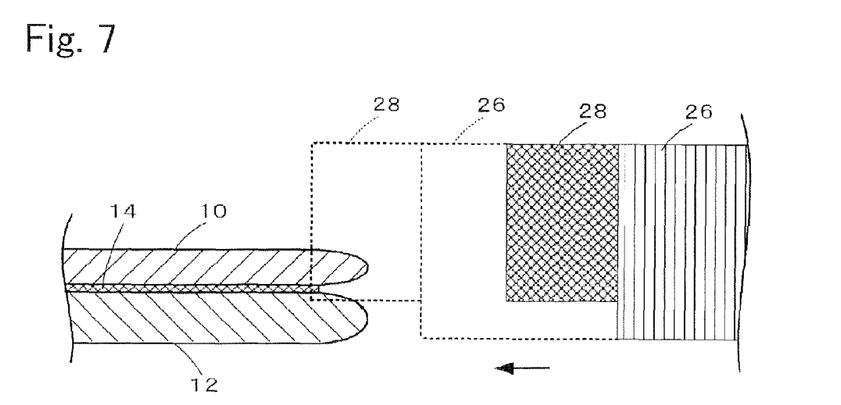
FIG. 7 is an A-A' fragmentary sectional view illustrating the movement of a grinding wheel 24 in grinding of a peripheral surface of a laminated substrate 16.

A peripheral surface of the laminated substrate 16 was then ground with a grinding apparatus (FIG. 4(c)). A grinding mechanism 20 of the grinding apparatus used will be described below. FIG. 6 is an explanatory drawing of the grinding mechanism 20. The grinding mechanism 20 is a mechanism in which a grinding wheel 24 at a previously adjusted height is rotated and moved horizontally to press a whetstone 28 of the grinding wheel 24 against a peripheral surface of the laminated substrate 16, which is held on a rotating holder 22 by vacuum suction with the silicon substrate 12 facing downward and is rotated in the same direction as the grinding wheel 24, to grind the peripheral surface. The whetstone 28 is a circular member having a rectangular cross section and is fixed to an upper side surface of the main body 26 of the grinding wheel. In the present example, the height of the grinding wheel 24 was adjusted such that the position of the undersurface of the whetstone 28 corresponded to the position 100 under the top of the silicon substrate 12. FIG. 7 illustrates the horizontal movement of the grinding wheel 24 in grinding of the peripheral surface of the laminated substrate 16. FIG. 7 is an A-A' fragmentary sectional view illustrating the horizontal movement of the grinding wheel 24 (for the section, see FIG. 6). A dotted line in the figure indicates the position of the grinding wheel 24 when the grinding wheel 24 is moved horizontally to finish grinding. After grinding, as illustrated in FIG. 4(c), the silicon substrate 12 was ground by 100 from the top and 1 mm from the periphery but had the initial outer diameter. The LT substrate 10 and the organic adhesive layer 14 were ground up to 1 mm inside the periphery of the silicon substrate 12. Thus, after grinding, a bevel of the LT substrate 10 was removed, and the peripheral surface of the LT substrate 10, the peripheral surface of the organic adhesive layer 14, and the peripheral surface of the silicon substrate 12 on the side of the organic adhesive layer were flush with each other.

Figure 4D:
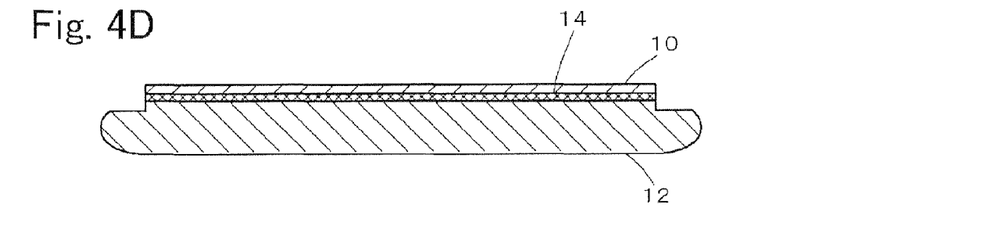
Figure 5:
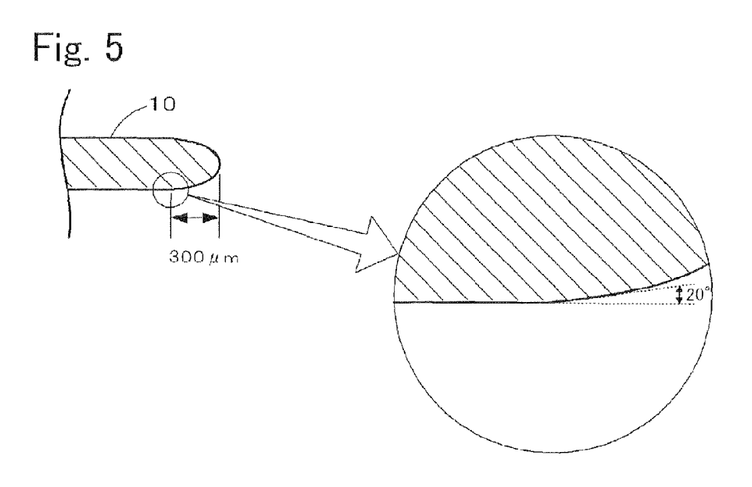
FIG. 5 is a fragmentary sectional view illustrating a bevel.

The LT substrate 10 was then lapped and polished with a lapper and polisher to a thickness of 30 μm (FIG. 4(d)). As the lapper and polisher, a lapper and polisher that could reduce the thickness and performing mirror polishing was used, as described below. More specifically, to reduce the thickness, a lapper and polisher was used such that the laminated substrate 16 after grinding of the peripheral surface of the laminated substrate 16 (a ground substrate) was placed between a lapping plate and a pressure plate, slurry containing abrasive grains was supplied between the ground substrate and the lapping plate, and the pressure plate was rotated while the ground substrate was pressed against the surface of the lapping plate by the pressure plate. Subsequently, to perform mirror polishing, a polisher was used such that the lapping plate was replaced with a lapping plate having a pad on the surface, the abrasive grains were replaced with abrasive grains having a higher grit number, and the pressure plate was rotated and revolved to perform mirror polishing of the surface of the piezoelectric substrate. The surface of the LT substrate that was a ground substrate was first pressed against the surface of the lapping plate and was polished at a rotation speed of 100 rpm for a polishing time of 60 min. The lapping plate was then replaced with a lapping plate having a pad on the surface, and the abrasive grains were replaced with abrasive grains having a higher grit number. Mirror polishing was performed under conditions where the pressure at which the ground substrate was pressed against the surface of the lapping plate was 0.2 MPa, the rotation speed was 100 rpm, the orbital speed was 100 rpm, and the polishing time was 60 min.

Figure 8:
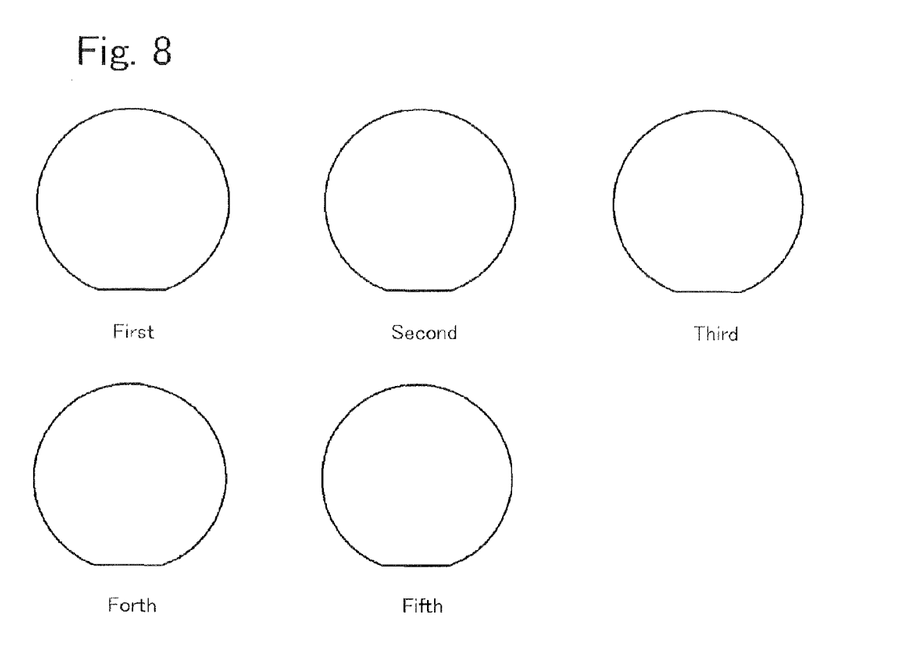
FIG. 8 shows freehand drawings illustrating chipping of an edge of an LT substrate in an example.

FIG. 8 illustrates chipping of an edge of the LT substrate 10 when five composite substrates were manufactured by this manufacturing process. FIG. 8 shows freehand drawings prepared by visually inspecting the chipping of an edge of the LT substrate 10. The figure shows that first to fifth composite substrates had no chipping.

Comparative Example 1

Figure 9:
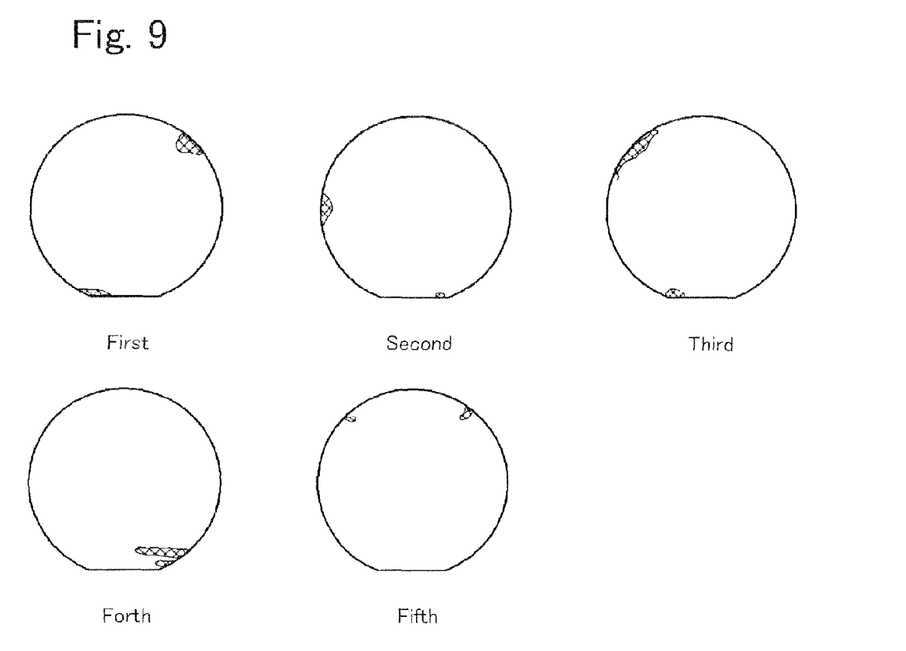
FIG. 9 shows freehand drawings illustrating chipping of an edge of an LT substrate in a comparative example.

A composite substrate was fabricated in the same way as in Example 1 except that, after the formation of the laminated substrate 16 illustrated in FIG. 4(b), the surface of the LT substrate 10 was lapped and polished with a tapper and polisher without grinding a peripheral surface of the laminated substrate 16. FIG. 9 illustrates chipping of an edge of the LT substrate 10 when five composite substrates were manufactured by this manufacturing process. FIG. 9 shows freehand drawings prepared by visually inspecting the chipping of an edge of the LT substrate 10. In the drawings, shaded areas indicate chips of the LT substrate 10. The figure shows that first to fifth composite substrates had a plurality of chips.

Example 2

A hundred composite substrates were fabricated in the same way as in Example 1 except that the LT substrate 10 was a 42° Y-cut X-propagation LT substrate, that the thickness of the silicon substrate 12 was 250 μm that the thickness of the organic adhesive layer 14 was 0.6 μm and that the peripheral surface of the laminated substrate 16 was ground after the height of the grinding wheel 24 was adjusted such that the position of the undersurface of the whetstone 28 corresponded to the position 50 under the top of the silicon substrate 12. In all of the 100 composite substrates thus fabricated, the LT substrate 10 had no chip.

Comparative Example 2

Fifty composite substrates were fabricated in the same way as in Example 2 except that the thickness of the silicon substrate 12 was 220 and that the surface of the LT substrate 10 was lapped and polished without grinding the peripheral surface of the laminated substrate 16. In 40 of the 50 composite substrates thus fabricated, the LT substrate 10 had a chip.

Example 3

A hundred composite substrates were fabricated in the same way as in Example 1 except that the supporting substrate was formed of borosilicate glass. In all of the 100 composite substrates thus fabricated, the LT substrate 10 had no chip.

Comparative Example 3

Fifty composite substrates were fabricated in the same way as in Example 3 except that the surface of the LT substrate 10 was lapped and polished without grinding the peripheral surface of the laminated substrate 16. In 35 of the 50 composite substrates thus fabricated, the LT substrate 10 had a chip.

Example 4

Fifty composite substrates were fabricated in the same way as in Example 1 except that the piezoelectric substrate was a lithium niobate substrate (64° Y-cut X-propagation LN substrate). In all of the 50 composite substrates thus fabricated, the LN substrate had no chip.

Comparative Example 4

Fifty composite substrates were fabricated in the same way as in Example 4 except that the surface of the LN substrate was lapped and polished without grinding the peripheral surface of the laminated substrate 16. In 30 of the 50 composite substrates thus fabricated, the LN substrate had a chip.

The results of Examples 1, 2, 3, and 4 and Comparative Examples 1, 2, 3, and 4 showed that the occurrence of chipping of the LT substrate 10 and the LN substrate during lapping and polishing was lower in lapping and polishing of the LT substrate 10 and the LN substrate after grinding of the peripheral surface of the laminated substrate 16 than in lapping and polishing of the LT substrate 10 and the LN substrate without grinding the peripheral surface of the laminated substrate 16.

Example 5

A hundred of the same composite substrates as in Example 1 were fabricated. A surface of the LT substrate 10 of the composite substrate thus fabricated was observed with a stereoscopic microscope. As a result, no organic adhesive layer 14 was deposited on the surface.

Comparative Example 5

Fifty composite substrates were fabricated in the same way as in Example 1 except that, after the formation of the laminated substrate 16 illustrated in FIG. 4(b) a peripheral surface of the LT substrate 10 was ground by 1 mm from the periphery without grinding a peripheral surface of the silicon substrate 12 of the laminated substrate 16 and the surface of the LT substrate 10 was lapped and polished with a lapper and polisher. A surface of the LT substrate 10 of the composite substrate thus fabricated was observed with a stereoscopic microscope. As a result, in all of the 50 composite substrates thus fabricated, part of the organic adhesive layer 14 was deposited.

Figure 10:
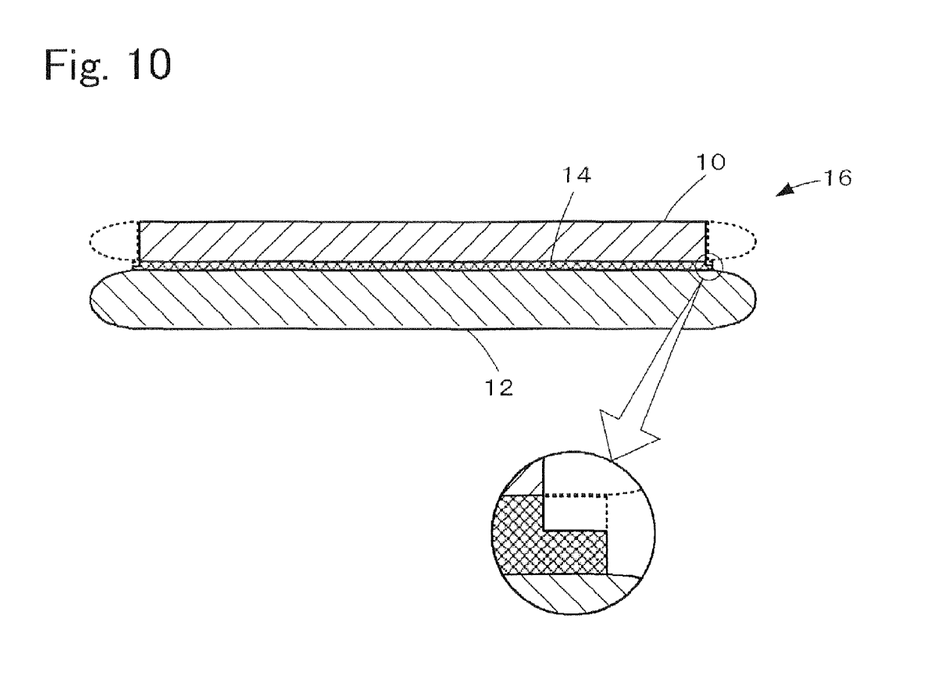
FIG. 10 is a cross-sectional view illustrating the state after grinding of a peripheral surface of the laminated substrate 16 in a comparative example.

The results of Example 5 and Comparative Example 5 showed that grinding the peripheral surface of the laminated substrate 16 such that the peripheral surface of the LT substrate 10, the peripheral surface of the organic adhesive layer 14, and the peripheral surface of the silicon substrate 12 on the side of the organic adhesive layer 14 were made flush with each other could prevent the organic adhesive layer 14 from being detached and attaching as a contaminant to the surface of the LT substrate 10 in the lapping and polishing step, as compared with grinding the peripheral surface of the LT substrate 10 without grinding the peripheral surface of the silicon substrate 12. This is probably due to the following reason. In Comparative Example 5, the peripheral surface of the LT substrate 10 was ground without grinding the peripheral surface of the silicon substrate 12. Therefore, part of the peripheral surface of the organic adhesive layer 14 was ground, and part of the organic adhesive layer 14 remained outside the peripheral surface of the LT substrate 10 after grinding (See the cross-sectional view after the grinding of the peripheral surface of the laminated substrate 16 illustrated in FIG. 10. A portion within a dotted line indicates a portion that has been ground.). In lapping and polishing of the surface of the LT substrate 10, the remaining portion of the organic adhesive layer 14 was probably detached and attached to the surface of the LT substrate 10. Contamination of the surface of the LT substrate 10 unfavorably results in a decrease in yield, for example, when electrodes are formed on the surface of the LT substrate 10 to fabricate a SAW filter. In Example 5, in grinding of the peripheral surface of the laminated substrate 16, the silicon substrate 12 was also ground. This ensures the removal of a portion of the organic adhesive layer 14 outside the peripheral surface of the LT substrate 10. This can prevent the organic adhesive layer 14 from being detached and attaching to the surface of the LT substrate 10.

Example 6

A composite substrate was fabricated in the same way as in Example 1 except that the thickness of the organic adhesive layer 14 was altered as shown in Table 1. In the composite substrate thus fabricated, an input electrode and an output electrode each formed of metallic aluminum were formed on the surface of the LT substrate to fabricate a SAW filter. The thermal expansion coefficient and the frequency-temperature characteristics of the SAW filter were determined. Table 1 shows the measurements. The LT substrate has a thermal expansion coefficient in the SAW propagation direction X of 16 ppm/° C. A single-crystal silicon substrate has a thermal expansion coefficient in the SAW propagation direction X of 3 ppm/° C. The results in Table 1 clearly showed that the frequency-temperature characteristics (temperature characteristics) were critically and markedly improved at a thickness of the organic adhesive layer in the range of 0.1 to 1.0 µm.

TABLE 1

| | Thickness of the organic adhesive layer (µm) | | | | | | |
|---|---|---|---|---|---|---|---|
| | 0.05 | 0.1 | 1 | 2 | 5 | 10 | 15 |
| Thermal expansion Coefficient (ppm/° C.) | 16 | 8 | 9 | 16 | 16 | 16 | 16 |
| Temperature characteristics (ppm/° C.) | −30 | −15 | −17 | −30 | −30 | −30 | −30 |

What is claimed is:
1. A method for manufacturing a composite substrate, comprising the steps of:
   (a) preparing a supporting substrate and a piezoelectric substrate having a beveled edge;
   (b) bonding a surface of the supporting substrate to the backside of the piezoelectric substrate with an organic adhesive layer interposed therebetween to form a laminated substrate;
   (c) grinding a peripheral surface of the laminated substrate such that a bevel of the piezoelectric substrate is removed and such that a peripheral surface of the piezoelectric substrate, a peripheral surface of the organic adhesive layer, and at least a portion of a peripheral surface of the supporting substrate on the side of the organic adhesive layer lie in the same vertical plane in the stacking direction of the piezoelectric/electrostrictive substrate, the organic adhesive layer and the supporting substrate so as to be flush with respect to each other; and (d) placing abrasive grains between the surface of the piezoelectric substrate and a lapping plate, and lapping the surface of the piezoelectric substrate with the lapping plate to reduce the thickness of the piezoelectric substrate and performing mirror polishing of the surface of the piezoelectric substrate, wherein the grinding of the peripheral surface of the laminated substrate in step (c) is performed so that at least part of the supporting substrate is removed while the initial outer diameter of the supporting substrate is maintained.

2. The method for manufacturing a composite substrate according to claim 1, wherein the grinding of a peripheral surface of the laminated substrate in the step (c) is performed such that a portion rising from a plane on the side of the organic adhesive layer in a portion of the supporting substrate having the initial outer diameter to the peripheral surface on the side of the organic adhesive layer has a curved surface.

3. The method for manufacturing a composite substrate according to claim 1, wherein
a supporting substrate having a smaller thermal expansion coefficient than the piezoelectric substrate is prepared in the step (a), and
the organic adhesive layer has a thickness in the range of 0.1 to 1.0 μm in the step (b).

4. The method for manufacturing a composite substrate according to claim 3, wherein
the piezoelectric substrate is formed of a material selected from the group consisting of lithium tantalate, lithium niobate, lithium niobate-lithium tantalate solid solution single crystal, lithium borate, langasite, and crystal, and
the supporting substrate is formed of a material selected from the group consisting of silicon, sapphire, aluminum nitride, alumina, borosilicate glass, and quartz glass.

* * * * *